US012540418B2

(12) United States Patent
Jalan et al.

(10) Patent No.: US 12,540,418 B2
(45) Date of Patent: Feb. 3, 2026

(54) SOLID SOURCE METAL-ORGANIC MOLECULAR BEAM EPITAXY FOR DEPOSITION OF ULTRA-LOW VAPOR PRESSURE METALS AND METAL OXIDES

(71) Applicant: Regents of the University of Minnesota, Minneapolis, MN (US)

(72) Inventors: Bharat Jalan, Roseville, MN (US); William Nunn, Minneapolis, MN (US); Anusha Kamath Manjeshwar, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 275 days.

(21) Appl. No.: 18/249,634

(22) PCT Filed: Oct. 20, 2021

(86) PCT No.: PCT/US2021/071939
§ 371 (c)(1),
(2) Date: Apr. 19, 2023

(87) PCT Pub. No.: WO2022/087594
PCT Pub. Date: Apr. 28, 2022

(65) Prior Publication Data

US 2023/0407520 A1 Dec. 21, 2023

Related U.S. Application Data

(60) Provisional application No. 63/198,458, filed on Oct. 20, 2020.

(51) Int. Cl.
*C30B 25/14* (2006.01)
*C23C 16/18* (2006.01)
(Continued)

(52) U.S. Cl.
CPC .............. *C30B 25/14* (2013.01); *C23C 16/18* (2013.01); *C23C 16/4485* (2013.01); *C30B 29/02* (2013.01)

(58) Field of Classification Search
CPC ......... C30B 29/02; C30B 25/14; C23C 16/18; C23C 16/4485
See application file for complete search history.

(56) References Cited

U.S. PATENT DOCUMENTS 3,607,676 A 9/1971 Uno et al.
5,494,704 A 2/1996 Ackerman
(Continued)

FOREIGN PATENT DOCUMENTS

FR 2995618 A1 * 3/2014 ............. C23C 16/18
JP 4789389 B2 * 10/2011 ............. C23C 16/18
WO WO-2008088563 A2 * 7/2008 .............. C07F 17/02

OTHER PUBLICATIONS

"Applications of Refractory Metals in Photovoltaic Thin Films," H.C. Starck Solutions, www.azom.com /article.aspx, Jul. 21, 2015, 4 pp.

(Continued)

*Primary Examiner* — Robert M Kunemund
(74) *Attorney, Agent, or Firm* — Shumaker & Sieffert, P.A.

(57) ABSTRACT

A system includes a vacuum chamber, and a substrate in the vacuum chamber includes a target surface. At least one effusion cell is in the vacuum chamber, wherein the effusion cell contains a solid metal-organic precursor compound with a vapor pressure of less than about $10^{-2}$ Torr at a temperature of about 25° C. to about 300° C. The effusion cell is configured to sublime the solid metal-organic precursor compound at a sublimation temperature greater than about 0° C. and less than about 200° C. such that a stream of metal particles from the solid metal-organic precursor compound
(Continued)

emanate from the effusion cell are directed toward to the target surface of the substrate to form a coating thereon.

21 Claims, 8 Drawing Sheets

(51) Int. Cl.
*C23C 16/448* (2006.01)
*C30B 29/02* (2006.01)

(56) References Cited

U.S. PATENT DOCUMENTS

| | | | | |
|---|---|---|---|---|
| 6,107,199 | A | 8/2000 | Allen et al. | |
| 6,653,212 | B1 | 11/2003 | Yamanaka et al. | |
| 6,838,573 | B1 * | 1/2005 | Farnia | C07C 49/92 427/587 |
| 2016/0276148 | A1 * | 9/2016 | Qian | H01L 21/02274 |

OTHER PUBLICATIONS

"Electron-Beam Evaporation for Thin-Film Deposition," https://www.findlight.net/blog/electron-beam-evaporation/, Jun. 30, 2019, 6 pp.
"Evaporation Systems," retrieved from https://www.ajaint.com/evaporation-systems.html, on Jun. 16, 2023, 2 pp.
"Osmium Tape," American Elements, https://www.americanelements.com/osmium-tape-7440-04-2, Revised Jan. 15, 2022, 6 pp.
"Platinum Thin Films, Platinized Substrates," Accessed on Jan. 4, 2020, retrieved from https://www.platypustech.com/platinum-thin-films, on Jun. 16, 2023, 2 pp.
"Thin Film Material Market Size, Share & Trends Analysis Report by Application, Regional Outlook, Competitive Strategies, and Segment Forecasts, 2019 to 2025," retrieved from https://www.grandviewresearch.com/industry-analysis/thin-film-material-market, on Jun. 16, 2023, 2 pp.
"Thin Film Semiconductor Deposition Market," retrieved from https://www.alliedmarketresearch.com/thin-film-semiconductor-deposition-market, on Jun. 16, 2023, 7 pp.
Aaltonen et al., "ALD of Rhodium Thin Films from Rh (acac) [sub 3] and Oxygen," Electrochemical and Solid State Letters, vol. 8, No. 8, Jan. 2005, pp. C99-C101.
Berg, "Low Temperature Heat Capacity of Platinum," Journal of Physics and Chemistry of Solids, vol. 30, No. 1, Jan. 1969, pp. 69-72.
Bhushan, "Bulk Materials, Coatings, and Surface Treatments for Tribology," Chapter 13, Principles and Applications of Tribology, 1999 (Applicant points out, in accordance with MPEP 609.04(a), that the year of publication, 1999, is sufficiently earlier than the effective U.S. filing date, so that the particular month of publication is not in issue.), pp. 805-897.
Christen et al., "Recent Advances in Pulsed-Laser Deposition of Complex-Oxides," Journal of Physics. Condensed Matter, vol. 20, No. 26, Jul. 2, 2009, 27 pp.
Corso et al., "In Situ Real-Time Investigation of Hydrogen-Induced Structural and Optical Changes in Palladium Thin Films," Journal of Alloys and Compounds, vol. 704, May 15, 2017, pp. 303-310.
Crowell, "Chemical Methods of Thin Film Deposition: Chemical Vapor Deposition, Atomic Layer Deposition, and Related Technologies," Journal of Vacuum Science & Technology, vol. 21, No. 5, Sep. 2003, pp. S88-S95.
Dendooven et al., "Low-Temperature Atomic Layer Deposition of Platinum Using (Methylcyclopentadienyl)trimethylplatinum and Ozone," The Journal of Physical Chemistry C, vol. 117, No. 40, Oct. 2013, pp. 20557-20561.
Dossi et al., "Chemical vapor deposition of platinum hexafluoracetylacetonate inside KL zeolite: a new route to nonacidic platinum-in-zeolite catalysts,", Journal of Catalysis, vol. 145, Jan. 1, 1994, pp. pp. 377-383, XP002985208.
Eyert et al., "On the Metallic Conductivity of the Delafossites PdCoO2 and PtCoO2," Chemistry of Materials, vol. 20, No. 6, Feb. 2008, 5 pp.
Flanagan et al., "A Design-Of-Experiments Approach to Modeling Activity Coefficients in Solvent Mixtures: a Case Study Using Platinum(II) Acetylacetonate in Mixtures of Acetone, Cyclohexanol, 1,2,3,4-Tetrahydronaphthalene and Propylene Carbonate," Green Chemistry, vol. 7, No. 5, May 2005, pp. 333-338.
Galinski et al., "Temperature-Dependent 2D-3D Growth Transition of Ultra-Thin Pt Films Deposited by PLD," Acta Materialia, vol. 61 No. 9, Jun. 2012, 7 pp.
Green, "Thin-Film Solar Cells: Review of Materials, Technologies and Commercial Status," Journal of Materials Science: Materials in Electronics, Jan. 2007, pp. S15-S19.
Guo et al., "Temperature dependence of the morphology and electronic structure of ultrathin platinum on TiO2-teminated SrTiO3 (001)", Journal of Vacuum Science, vol. 35, No. 6, Oct. 5, 2017, 5 pp.
Hamalainen et al., "Iridium Metal and Iridium Oxide Thin Films Grown by Atomic Layer Deposition at Low Temperatures," Journal of Materials Chemistry, vol. 21, Oct. 2011, pp. 16488-16493.
Hecq et al., "Oxygen Induced Preferred Orientation of DC Sputtered Platinum," Journal of Vacuum Science and Technology, vol. 18, No. 2, Mar. 1981, pp. 219-222.
Helmersson et al., "Ionized Physical Vapor Deposition (IPVD): A Review of Technology and Applications," Thin Solid Films, Aug. 2006, 80 pp.
Hiskes et al., Single Source Metalorganic Chemical Vapor-Deposition of Low Microwave Surface-Resistance YBa2Cu3O7, Applied Physics Letters, vol. 59, No. 5, Jul. 29, 1991, pp. 606-607.
International Preliminary Report on Patentability from International Application No. PCT/US2021/071939 dated May 4, 2023, 7 pp.
International Search Report and Written Opinion of International Application No. PCT/US2021/071939, dated Apr. 4, 2022, 11 pp.
Jalan et al., "Growth of High-Quality SrTiO3 Films Using a Hybrid Molecular Beam Epitaxy Approach," Journal of Vacuum Science & Technology A, vol. 27, No. 3, May 2009, pp. 461-464.
Jilani et al., "Chapter 8: Advance Deposition Techniques for Thin Film and Coating," Modern Technologies for Creating the Thin-film Systems and Coatings, ? In TechOpen, Mar. 8, 2017, pp. 137-149.
Kahsay et al., "Growth of Epitaxial Pt Thin Films on (0 0 1) SrTiO3 by rf Magnetron Sputtering," Applied Surface Science, vol. 306, Jul. 1, 2014, pp. 23-26.
Kajdos et al., "Two-Dimensional Electron Gas in a Modulation-Doped SrTiO3/Sr(Ti,Zr)O3 Heterostructure," Applied Physics Letters, vol. 103, No. 8, Jul. 2013, 27 pp.
Kasai et al., "Surface Structure and Electrochemical Properties of Platinum Films Grown on SrTiO 3 (100) Substrates," Surface Science, vol. 666, Dec. 2017, pp. 14-22.
Kockert et al., "Absolute Seebeck Coefficient of Thin Platinum Films," Journal of Applied Physics, vol. 126, No. 10, Sep. 2019, 9 pp.
Lu et al., "Pt Magnetic Polarization on Y3Fe5O12 and Magnetotransport Characteristics," Physical Review Letters, vol. 110, No. 14, Apr. 2013, 5 pp.
Lu et al., "Solid Source MOCVD for the Epitaxial Growth of Thin Oxide Films," Journal of Crystal Growth, vol. 128, Mar. 1, 1993, pp. 788-792.
MacDonald, "CRC Handbook of Chemistry and Physics: From Paper to Web," Abstract, Abstracts of Papers, 225th ACS National Meeting, Mar. 23-27, 2003, 2 pp.
Meyer et al., "Temperature Dependent Spin Transport Properties of Platinum Inferred From Spin Hall Magnetoresistance Measurements," Applied Physics Letters, vol. 104, Jan. 2014, 5 pp.
Morozova et al., "Study of temperature dependencies of saturated vapor pressure of ruthenium (III) beta-diketonate derivatives", Journal of Thermal Analysis and Calorimetry, vol. 98, No. 2, Jul. 25, 2009, pp. 395-399, XP019751507.
Morozova et al., "Vapor Pressure of Precursors for CVD on the Base of Platinum Group Metals," Journal de Physique IV (Proceedings), Aug. 2001, pp. 609-616.

(56) References Cited

OTHER PUBLICATIONS

Moyer et al., "Highly Conductive SrVO 3 as a Bottom Electrode for Functional Perovskite Oxides," Advanced Materials, vol. 25, No. 26, Jul. 2013, pp. 3578-3582.
Ong et al., "Unusual Transport and Strongly Anisotropic Thermopower in PtCoO2 and PdCoO2." Physical Review Letters, vol. 104, No. 17, Apr. 2010, 4 pp.
Poker et al., "Temperature-Dependence of Electrical-Resistivity of Vanadium, Platinum, and Copper," Physical Review B, vol. 26, No. 10, Nov. 15, 1982, pp. 7012-7014.
Polli et al., "Growth of Platinum on TiO2- and SrO-Terminated SrTiO3(100)," Surface Science, vol. 448. No. 2-3, Mar. 2000, pp. 279-289.
Popovici et al., "Atomic Layer Deposition of Ruthenium Thin Films from (Ethylbenzyl) (1-Ethyl-1,4-cyclohexadienyl) Ru: Process Characteristics, Surface Chemistry, and Film Properties," Chemistry of Materials, vol. 29, No. 11, May 2017, pp. 4654-4666.
Prakash et al., "Hybrid Molecular Beam Epitaxy for the Growth of Stoichiometric BaSnO3," Journal of Vacuum Science & Technology A Vacuum Surfaces and Films, vol. 33, No. 6, Oct. 2015, 6 pp.
Rossnagel, "Thin Film Deposition with Physical Vapor Deposition and Related Technologies," Journal of Vacuum Science & Technology A Vacuum Surfaces and Films, vol. 21, No. 5, Sep. 2003, pp. S74-S87.
Roy et al., "Biomedical Applications of Diamond-Like Carbon Coatings: A Review," Journal of Biomedical Materials Research, Part B, Oct. 2007, pp. 72-84.
Sagasta et al., "Tuning the Spin Hall Effect of Pt from the Moderately Dirty to the Superclean Regime," Physical Review B, vol. 94, Aug. 30, 2016, 11 pp.
Sarakinos et al., "High Power Pulsed Magnetron Sputtering: A Review on Scientific and Engineering State of the Art," Surface & Coatings Technology, vol. 204, No. 11, Feb. 2010, pp. 1661-1684.
Schlom, "Perspective: Oxide Molecular-Beam Epitaxy Rocks!," APL Materials 3, May 26, 2015, 5 pp.
Schmitz, "Low Temperature Thin Films for Next-Generation Microelectronics (Invited), "Surface & Coatings Technology, vol. 343, Nov. 2017, pp. 83-88.
Selvakumar et al., "Review of Physical Vapor Deposited (PVD) Spectrally Selective Coatings for Mid- and High-Temperature Solar Thermal Applications," Solar Energy Materials & Solar Cells, vol. 98, No. 2, Mar. 2012, pp. 1-23.
Son et al., "Strain Relaxation in Epitaxial Pt Films on (001) SrTiO3," Journal of Applied Physics, vol. 106, No. 4, Sep. 2009, 3 pp.
Stormer, "Nobel Lecture: The Fractional Quantum Hall Effect," Review of Modern Physics, vol. 71, No. 4, Jul. 1999, pp. 875-889.
Tien, "Light Waves in Thin Films and Integrated Optics," Applied Optics, vol. 10, No. 11, Nov. 1, 1971, 19 pp.
Vassen et al., "Interstitial Migration of Hydrogen and Helium in Platinum," Physical Review B, vol. 37, No. 6, Feb. 15, 1988, pp. 2911-2917.
Voevodin et al., "Nanocomposite Tribological Coatings for Aerospace Applications," Surface and Coatings Technology, vol. 116-119, Sep. 1999, pp. 36-45.
Wang et al., "Hydrogen Transfer Hydrogenation of Nitrobenzene to Aniline with Ru(acac)3 as the Catalyst," Research on Chemical Intermediates, vol. 40, No. 8, Oct. 2013, pp. 3109-3118.
White et al., "Iridium film growth with iridium tris-acetylacetonate: Oxygen and substrate effects", Thin Solid Films, vol. 346, No. 1-2, Jun. 1, 1999, pp. 100-107, XP004177664.
Zhou et al., "Investigation of Platinum Films Grown on Sapphire (0 0 0 1) by Molecular Beam Epitaxy," Journal of Crystal Growth, vol. 234, No. 2-3, Jan. 2002, pp. 561-568.
Zhu et al., "Variation of the Giant Intrinsic Spin Hall Conductivity of Pt with Carrier Lifetime," Science Advances, Jul. 19, 2019, 8 pp.

* cited by examiner

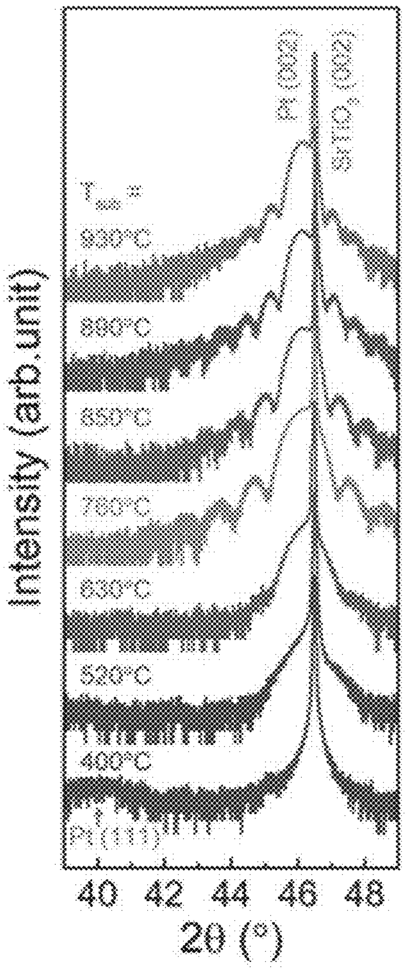
FIG. 4(a)
$T_{sub}$ = 930°C
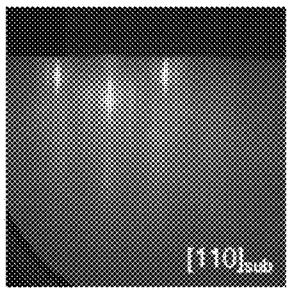
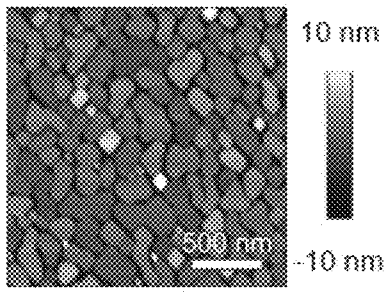
FIG. 4(b) FIG. 4(c)
$T_{sub}$ = 760°C
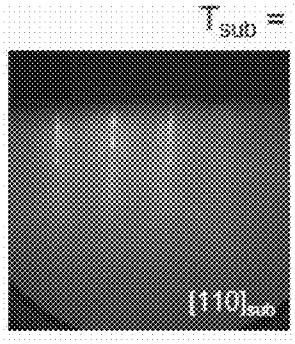
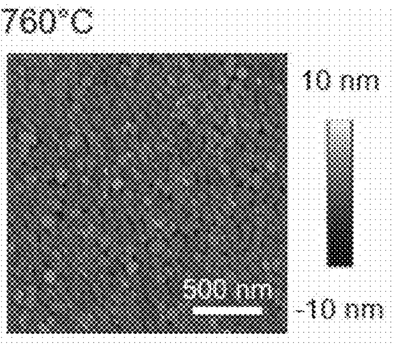
FIG. 4(d) FIG. 4(e)
$T_{sub}$ = 630°C
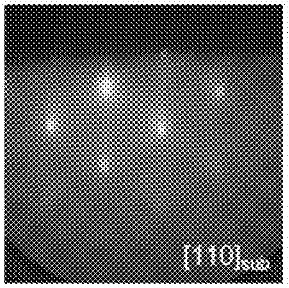
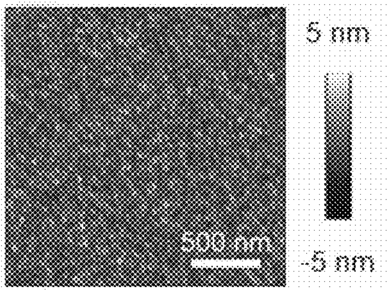
FIG. 4(f) FIG. 4(g)

SOLID SOURCE METAL-ORGANIC MOLECULAR BEAM EPITAXY FOR DEPOSITION OF ULTRA-LOW VAPOR PRESSURE METALS AND METAL OXIDES

This application is a national stage entry of International Patent Application No. PCT/US2021/071939, filed Oct. 20, 2021, which claims priority to U.S. Provisional Patent Application 63/198,458, filed Oct. 20, 2020, the entire content of which is incorporated by reference.

STATEMENT OF FEDERALLY FUNDED RESEARCH AND DEVELOPMENT

This invention was made with government support under DE-SC0020211 awarded by the U.S. Department of Energy, and FA9550-19-1-0245 awarded by the Air Force Office of Scientific Research. The government has certain rights in the invention.

BACKGROUND

Improvements in thin film deposition processes have profoundly impacted many technology innovations and advancements, not only by shaping the current electronics industry but by also greatly affecting areas such as optics, solar cells, coatings, biomedical devices, and aerospace engineering. A physical vapor deposition (PVD) tool referred to as molecular beam epitaxy (MBE) has been used to grow low defect metallic films. MBE has low energy deposition relative to other PVD techniques such as sputtering or pulsed laser deposition Many desirable metals have ultra-low vapor pressures and therefore require extremely high temperatures to evaporate or sublimate for use in MBE. For example, effusion cells are suitable for the sublimation of certain materials, but their use for refractory and noble metals such as Pt, Ru, Ir, and W can prove difficult. To overcome this problem and increase vapor pressure, electron beam evaporators can be used to heat a material to much higher temperatures than attainable in an effusion cell. However, in electron beam evaporation processes, maintaining a constant flux of particles is difficult due to extremely localized heating of the precursor material, and controlling the relative fluxes of multiple precursor materials can be difficult when producing thin films with more complex compositions.

Other problems can occur in MBE when growth is complicated with the addition of gases such as oxygen for the synthesis of oxide materials. Oxidation of source materials as well as the low oxidation potentials of some metals can make the growth of oxides difficult. Attempts at overcoming these problems have been made through the use of hybrid or metal-organic MBE (MOMBE), which utilizes volatile metal-organic precursors containing the desired metal to be deposited. This precursor is injected into a vacuum chamber through an exterior gas inlet system. In hybrid MBE processes, the metal-organic precursors are placed in a bubbler outside the vacuum chamber and evaporated as a liquid with a large vapor pressure of about 10 Torr at operating temperature. Although volatile metal-organic precursors can in some cases be used to deposit metals with low vapor pressures, the lack of suitable metal-organic precursors has limited the use of MOMBE processes.

SUMMARY

In general, the present disclosure is directed to solid source hybrid MBE systems and methods, which can be used to supply metallic elements to grow metals or metal-containing materials in thin film deposition processes, specifically targeting deposition of ultra-low vapor pressure elements onto a target substrate. In the method of the present disclosure, a solid metal-organic precursor compound with an intermediate vapor pressure of about $10^{-5}$ to about $10^{-2}$ Torr at operating temperature is placed in a low-temperature effusion cell directly in a vacuum chamber and sublimed at a temperature of less than about 300° C. to produce a flow of metal-containing molecules directed toward a target surface to grow a thin metal film. The low sublimation temperature reduces or substantially eliminates oxidation of the precursor and significantly cases operation when compared to the extremely high temperatures typically needed for ultra-low vapor pressure metals.

Current MOMBE processes require a liquid metal-organic precursor compound with a high vapor pressure of about 10 Torr be placed in a bubbler external to the vacuum chamber where the metal deposition occurs. In contrast, the methods of the present disclosure utilize a lower vapor pressure solid metal-organic precursor compound that can be inserted into an effusion cell and sublimed at low temperatures, with all components being inside the vacuum chamber. Since the solid metal-organic precursor and the effusion cell are within the vacuum system, less volatile compounds can be used while still not needing a carrier gas. With no carrier gas, the metal particles emerging from the effusion cell have a large mean free path which can provide high quality materials indicative of MBE growth and still be cost-effective growth of the desired thin film.

In one aspect, the present disclosure is directed to a system including a vacuum chamber, and a substrate in the vacuum chamber includes a target surface. At least one effusion cell is in the vacuum chamber, wherein the effusion cell contains a solid metal-organic precursor compound with a vapor pressure of less than about $10^{-2}$ Torr at a temperature of about 25° C. to about 300° C. The effusion cell is configured to sublime the solid metal-organic precursor compound at a sublimation temperature greater than about 0° C. and less than about 200° C. such that a stream of metal particles from the solid metal-organic precursor compound that emanate from the effusion cell are directed toward to the target surface of the substrate to form a coating thereon.

In another aspect, the present disclosure is directed to a method for making a coating. The method includes subliming at a sublimation temperature of greater than about 0° C. and up to about 200° C. a solid metal-organic precursor compound having a vapor pressure of less than about $10^{-2}$ Torr at a temperature of about 25° C. to about 300° C. to form a flow of metal particles; and directing the flow of metal particles toward a target surface to form the coating thereon.

In another aspect, the present disclosure is directed to a metal coating on a substrate, wherein the metal coating is formed from a stream of metal particles derived from subliming at a sublimation temperature of greater than about 0° C. and up to about 200° C. a solid metal-organic precursor compound having a vapor pressure of less than about $10^{-2}$ Torr at a temperature of about 25° C. to about 300° C.

In another aspect, the present disclosure is directed to a device including an electronic component, wherein at least a portion of the electronic component is coated with a metal coating formed from a stream of metal particles derived from subliming at a sublimation temperature of greater than about 0° C. and up to about 200° C. a solid metal-organic precursor compound having a vapor pressure of less than about $10^{-2}$ Torr at a temperature of about 25° C. to about 300° C.

In another aspect, the present disclosure is directed to a system including a vacuum chamber; a substrate in the vacuum chamber, wherein the substrate includes a target surface; at least one effusion cell in the vacuum chamber, wherein the effusion cell contains a solid metal-organic precursor compound with a vapor pressure of less than about $10^{-2}$ Torr at a temperature of about 25° C. to about 250° C. and a controller configured to operate the effusion cell to sublime the solid metal-organic precursor compound at a sublimation temperature greater than about 0° C. and less than about 200° C. such that a stream of metal particles from the solid metal-organic precursor compound emanate at a predetermined effusion rate from the effusion cell and are directed toward the target surface of the substrate to form a coating thereon.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

FIG. 3(*b*) is a schematic depiction of the deposition technique used in the examples.

FIGS. 4(*a*)-(*g*) are structural characterizations of platinum on $SrTiO_3$ substrates obtained as described in the examples below.

FIG. 4(*a*) is a high-resolution x-ray diffraction (HRXRD) image of Pt films on $SrTIO_3$ (001) substrates of Example 1 with increasing substrate temperature from bottom to top.

FIGS. 4(*b*), (*d*) and (*f*) are reflection high-energy electron diffraction (RHEED) patterns, and FIGS. 4(*c*) (*e*) and (*g*) are atomic force microscope (AFM) images, of substrate temperatures 930° C., 760° C., and 630° C., respectively for the coatings of Example 1.

FIG. 5(*a*) is a HRXRD plot, FIG. 5(*b*) is a RHEED pattern, and FIG. 5(*c*) is an AFM image of a 70 nm platinum film on conducting Nb-doped $SrTO_3$ (001) substrate.

FIG. 5(*d*) is a plot of temperature dependent resistivity of a 70 nm platinum film on an insulating $SrTiO_3$ (001) substrate. The red line is a fit to the Bloch-Grüneisen equation.

FIGS. 7(*b*)-(*c*) show RHEED patterns of a film grown at 300° C.

FIG. 7(*d*) is an AFM image of a film grown at 300° C.

FIG. 7(*e*) is a plot of the full-width half maximum (FWHM) vs. substrate temperature of a $RuO_2$ (101) rocking curve.

FIG. 7(*f*) is a plot of resistivity vs temperature of films grown at 300° C. with different thicknesses compared to the bulk (black).

FIG. 8(*b*) is a plot of resistivity vs temperature of the films of FIG. 8(*a*) compared to the bulk materials.

Like symbols in the drawings indicate like elements.

DETAILED DESCRIPTION

Figure 1:
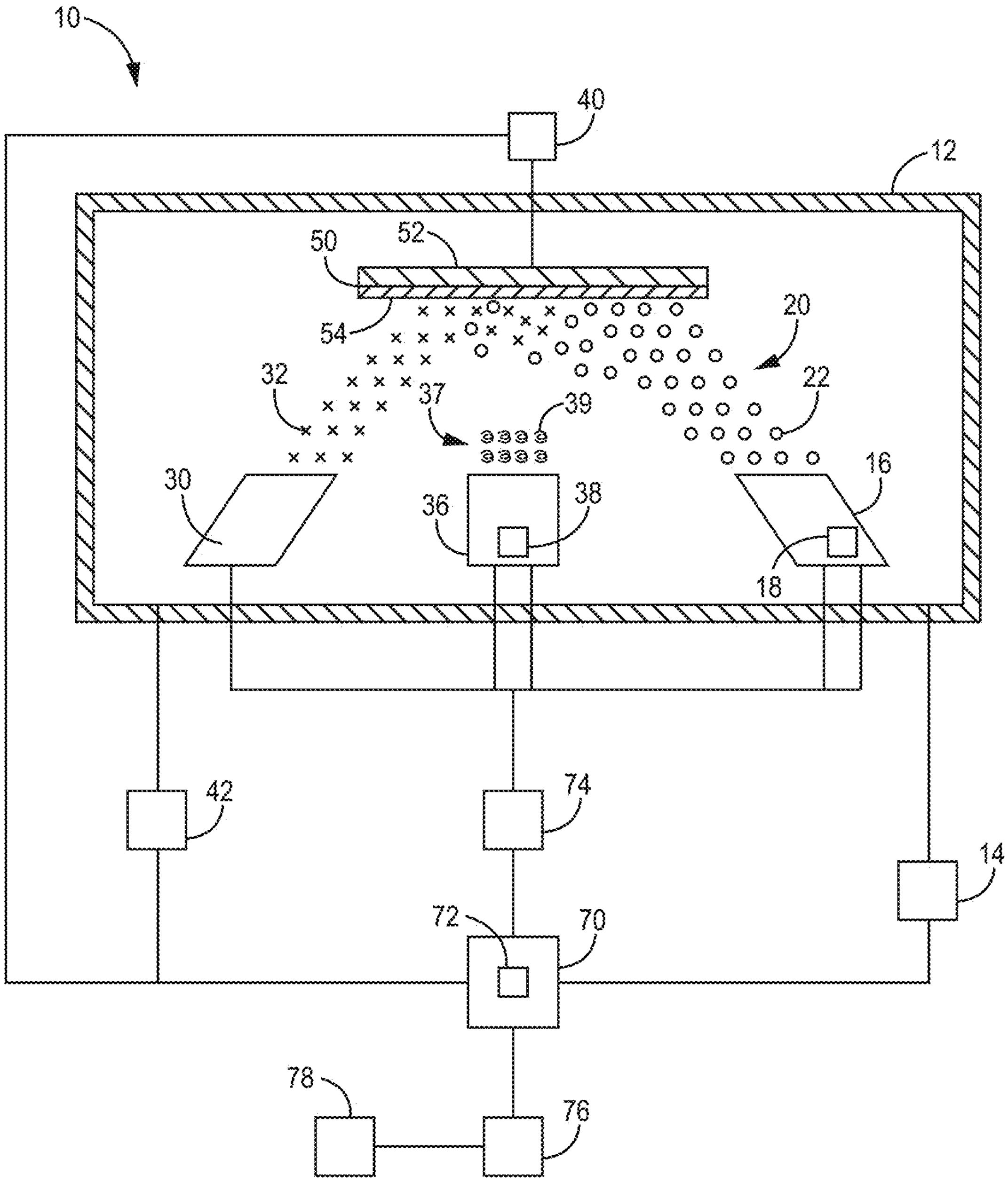
FIG. 1 is a schematic cross-sectional view of an example embodiment of a solid-source molecular beam epitaxy (MBE) system according to the present disclosure.

Referring now to FIG. 1, a system 10 for depositing a coating using solid source molecular beam epitaxy (MBE) includes a vacuum chamber 12 evacuated by a vacuum pump system 14. An effusion cell 16 is located within the vacuum chamber 12. A solid metal-organic precursor compound 18, which includes a metal to be deposited on a target surface 50 of a substrate 52, is within the effusion cell 16.

In various embodiments, the substrate 52 may be any material capable of supporting a deposited metal coating. For example, in some embodiments the target surface 50 of the substrate 52 may be made of Si, $SiO_2$, $Al_2O_3$, AlN, $SrTiO_3$, or other crystalline materials depending on the desired application. In some embodiments, the target surface may optionally be doped with another element to, for example, provide a preferred structure for the as-deposited metal film or coating. In one non-limiting example, the $SrTiO_3$ substrate may be doped with Nb, La, Nd and mixtures and combinations thereof.

The solid metal-organic precursor compound has a vapor pressure of less than about $10^{-2}$ Torr, or about $10^{-2}$ Torr to about $10^{-5}$ Torr, at a temperature over a temperature range of about 25° C. to about 300° C. When activated, the effusion cell 16 heats the solid metal-organic precursor compound 18 to a temperature of less than about 300° C., or less than about 100° C., or less than about 85° C., or less than about 65° C., and causes the metal-organic precursor compound to sublime, which produces a flow or beam 20 of metal particles 22 directed toward the target surface 50. The metal particles 22 collect on the target surface 50 to produce a thin film coating 54 of the metal liberated from the metal-organic precursor compound 18, while the accompanying organics are not incorporated.

In some embodiments, the system 10 includes an optional oxygen source 30 configured to supply a flow of oxygen atoms 32 (for example, O, $O_2$, $O_3$ and the like) toward the target surface 50. In various embodiments the oxygen atoms 32 can be used to, for example, oxidize the coating 54 or control the orientation of the metal in the coating 54. In one example embodiment, the oxygen source 30 may be used to control the (001) orientation of Pt atoms deposited in the coating 54.

The system 10 includes an optional heater 40 to heat the substrate 52 and the target surface 50. In some embodiments, the heater 40 can heat the target surface 50 to a temperature of about 400° C. to about 1000° C., or about 450° C. to about 950° C., or about 500° C. to about 850° C. In some examples, selecting the temperature of the target surface 50 can impact one or more structural characteristics of the coating 54.

In some embodiments, the system 10 includes one or more optional additional effusion cells 36 including a metal or metal-organic precursor compound 38, which may be the same or different from the metal-organic precursor compound 18 in the effusion cell 16. The effusion cell 36 sublimes the metal-organic precursor compound 38 to produce a flow or beam 37 of metal particles 39 directed toward the target surface 50. In various embodiments, the additional effusion cells 36 may be used to form more complex binary or ternary coatings 54 including the metal particles 39, or may be used to increase an overall deposition rate of the metal particles onto the target surface 50.

The system 10 does not require a carrier gas be supplied to the vacuum chamber 12, and the lack of a carrier gas increases the mean free path of the metal particles 22, 39 and the oxygen atoms 32, allowing for increased material structural quality. However, in some embodiments the system 10 can include an optional carrier gas source 42 to supply a carrier gas to the vacuum chamber 12.

In various examples shown schematically in FIG. 1, the various components in the system 10 may be interfaced with a controller 70 having at least one processor 72. The controller 70 may be configured to control one or more parameters of the effusion cells 16, 36, the oxygen source 30, the heater 40, the vacuum pump 14, or the carrier gas source 42 to determine one or more physical or chemical properties of the coating 54.

In some examples, the controller 70 may be configured to process detected signals from one or more sensor systems 74 in the vacuum chamber 12 or on the system 10. The processor 72 may be integrated with the sensor systems 74, may be integrated with the controller 70, or may be a remote processor functionally connected to the controller 70.

The processor 72 may be any suitable software, firmware, hardware, or combination thereof. The processor 72 may include any one or more microprocessors, controllers, digital signal processors (DSPs), application specific integrated circuits (ASICs), field-programmable gate arrays (FPGAs), or discrete logic circuitry. The functions attributed to the processor 72 may be provided by processing circuitry of a hardware device, e.g., as supported by software and/or firmware.

In some examples, the processor 72 may be coupled to a memory device 76, which may be part of the controller 70 or remote thereto. The memory device 76 may include any volatile or non-volatile media, such as a random-access memory (RAM), read only memory (ROM), non-volatile RAM (NVRAM), electrically erasable programmable ROM (EEPROM), flash memory, and the like. The memory device 76 may be a storage device or other non-transitory medium. The memory device 76 may be used by the processor 72 to, for example, store fiducial information or initialization information corresponding to, for example, sublimation temperatures for the metal-organic precursor compounds 18, 38, angles of the effusion cells 16, 36 or the oxygen source 30 with respect to the target surface 50, target deposition rates for the metal-organic precursor compounds 18, 38, surface geometries of formed coatings 54, temperatures of the target surface 50, pressure within the vacuum chamber 14, or deposition and process times. In some examples, the memory device 76 may store determined values of any of these parameters for later retrieval.

In some embodiments, the controller 70 and the processor 72 are coupled to a user interface 78, which may include a display, user input, and output (not shown in FIG. 1). Suitable display devices include, for example, monitor, PDA, mobile phone, tablet computers, and the like. In some examples, user input may include components for interaction with a user, such as a keypad and a display such as a cathode ray tube (CRT) display, a liquid crystal display (LCD) or light emitting diode (LED) display, and the keypad may take the form of an alphanumeric keypad, or a reduced set of keys associated with particular functions. In some examples, the displays may include a touch screen display, and a user may interact with user input via the touch screens of the displays. In some examples, the user may also interact with the user input remotely via a networked computing device.

The controller 70 can be configured to control any selected number of functions of the system 10 in response to signals from the processor 72 input manually into the controller 70, or stored in the memory device 76. In some examples, the controller 70 can be configured to generate control signals obtained from, for example, one or more sensors in the sensor system 74, to provide closed loop control of the parameters of the effusion cells 16, 36, the oxygen source 30, and the like to control the deposition of the coating 54.

In various examples, the controller 70 may be adjusted by a variety of manual and automatic means. Automatic means may make use of any number of control algorithms or other strategies to achieve desired conformance to a predetermined set of properties of the coating 54. For example, standard control schemes as well as adaptive algorithms such as so-called "machine-learning" algorithms may be used. In some examples, controller 70 can utilize information from other sources such as, for example, infrared cameras, to determine the control action decided by algorithms such as PID control schemes or machine learning schemes.

The metal-organic precursor compounds 18, 38 may include any organometallic or metal-organic compound in which a metal to be deposited is associated with an organic group. In various embodiments, the metal may be complexed with or bound to the organic group in a wide variety of ways including ionic or covalent bonding.

In various embodiments, the metal-organic precursor compound should have a vapor pressure of less than about $10^{-2}$ Torr to about $10^{-5}$ Torr over a working range of about 25° C. to about 300° C. and as such readily sublimes in the low-temperature effusion cells 16, 36. In various embodiments, the metal-organic precursor compounds should sublime to release a bound metal atom at a sublimation temperature of greater than about 25° C. to less than about 300° C. or less than about 200° C., or less than about 150° C., or less than about 100° C., or less than about 85° C. or even less than about 65° C. The metal-organic precursor compound should also be substantially thermally stable up to the sublimation temperature.

Figure 2:
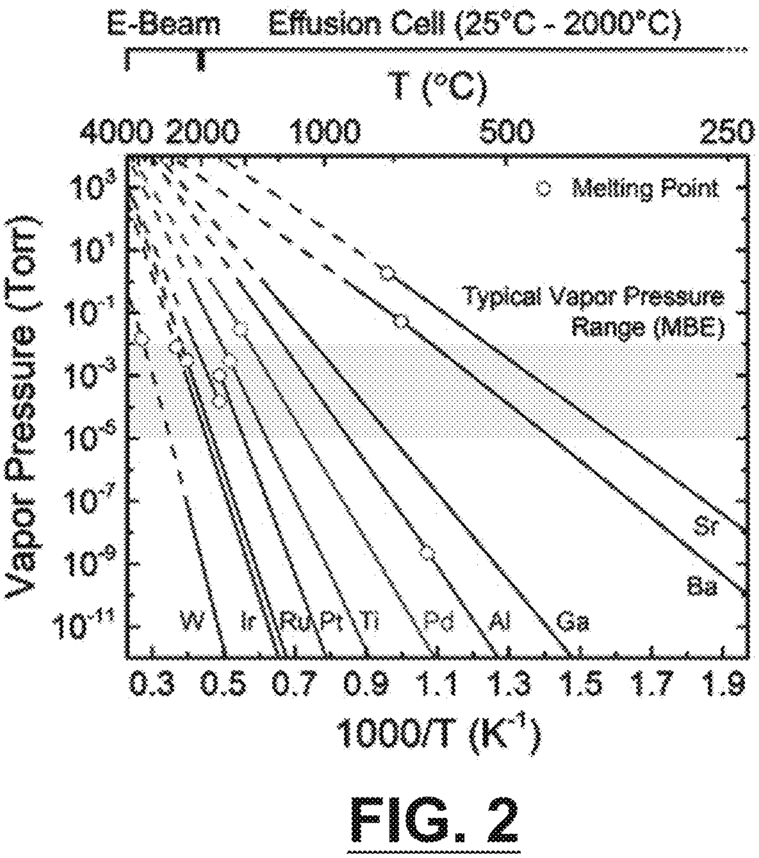
FIG. 2 is a plot of the temperature dependent vapor pressure of various metals that can potentially be used in MBE deposition processes. The melting points are shown as open circles and dashed lines are linear extrapolations. The typical vapor pressure range used in MBE is highlighted.

In various embodiments, which are not intended to be limiting, the metal-organic precursor compound can be complexed with or bound to any metal. The systems and processes of the present disclosure metals have been found especially suitable to deposit metals with low vapor pressures. As shown in FIG. 2, suitable examples include, but are not limited to Pt, Ru, Ir, Os, W, and alloys and mixtures thereof.

In various embodiments, any of these low vapor pressure metals may be bound to or complexed with an organic group such as a diketonate. In some examples, which are not intended to be limiting, the diketonate may be acetylacetonate (acac), phenylacetonates (phac), and the like. In one example, the solid metal-organic precursor compound includes a β-diketonate with a metal chosen from Pt, Ir, Ru, and combinations thereof such as for example, platinum (II) acetylacetonate ($Pt(acac)_2$), ruthenium (III) acetylacetonate ($Ru(acac)_3$) and iridium (III) acetylacetonate ($Ir(acac)_3$).

Figure 3A:
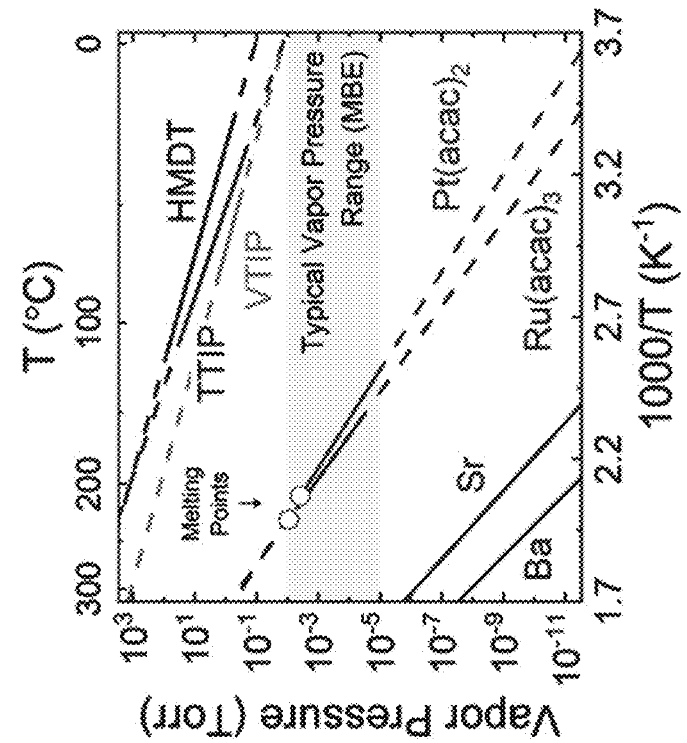
FIG. 3(*a*) is a plot of the temperature dependent vapor pressure of the platinum containing metal-organic precursor used in the examples, $Pt(acac)_2$, compared to commonly used metals and metal-organics. The open circle is the melting point and dashed lines are linear extrapolations.
Figure 3B:
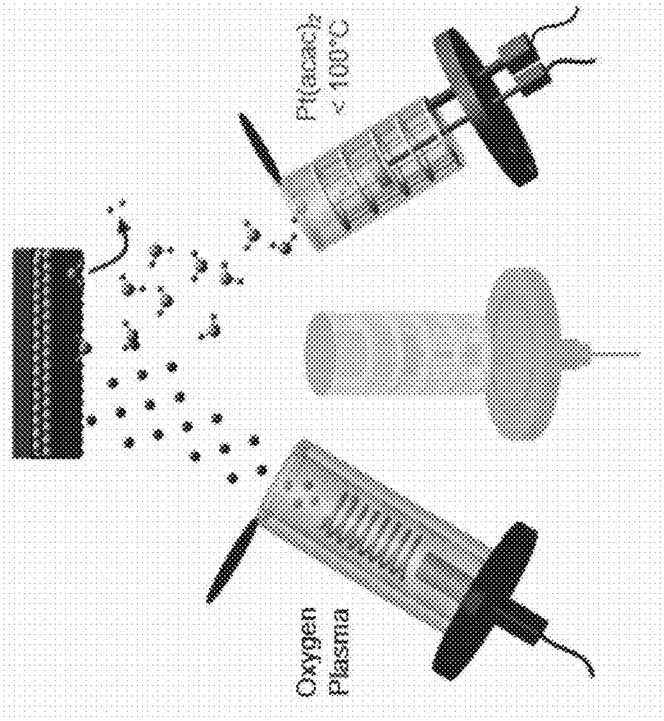
Figure 5A:
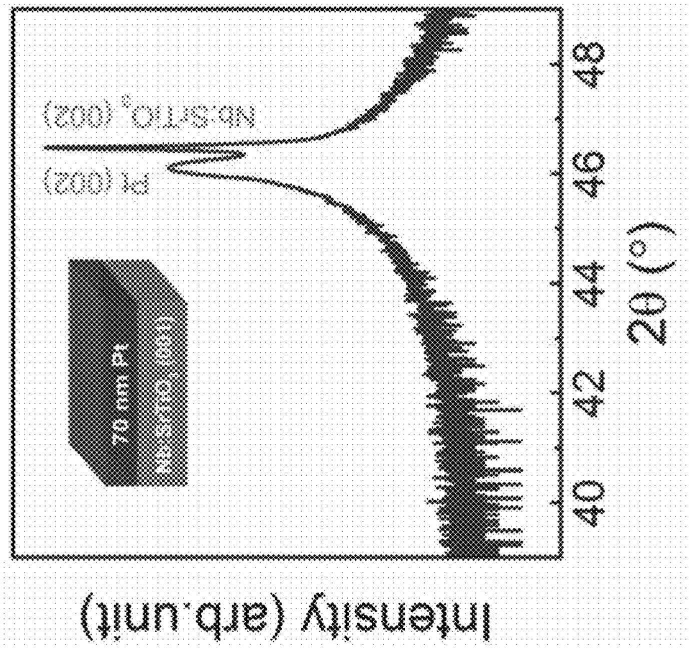
FIGS. 5(*a*)-(*d*) show structural characterization of platinum on Nb-doped $SrTiO_3$ substrates and resistivity on undoped $SrTiO_3$ as described in Examples 2-3.
Figure 5B:
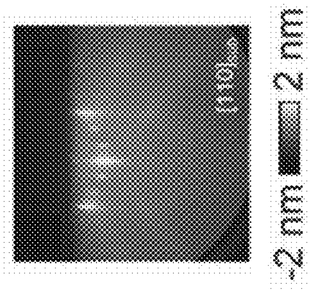
Figure 5C:
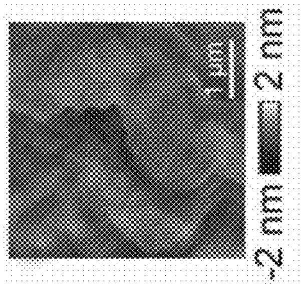
Figure 5D:
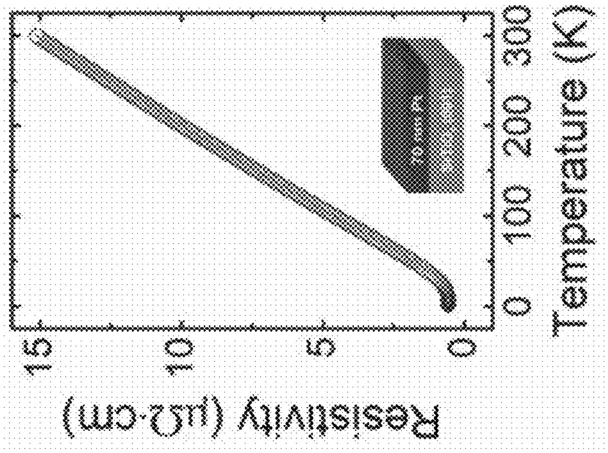

As examples, the temperature dependent vapor pressure of $Pt(acac)_2$ and ($Ru(acac)_3$ are shown in the plots of FIG. 3(*a*). FIG. 3(*a*) shows the vapor pressure of $Pt(acac)_2$ and $Ru(acac)_3$ compared to metallic elements like Ba and Sr, and volatile metal-organics like vanadium (V) oxytriisopropoxide (VTIP), titanium(IV) tetraisopropoxide (TTIP), and hexamethylditin (HMDT). $Pt(acac)_2$ and $Ru(acac)_3$ are also solids at these temperatures, with a melting point of 240° C. and 260° C., respectively, which is important for its ease of use in an effusion cell. Finally, $Pt(acac)_2$ and $Ru(acac)_3$ are thermally stable until about 210° C. and 230° C., respectively, indicating thermal decomposition should not occur. Utilizing these materials can take advantage of the inherent oxidation state of the metal in the metal-organic complex, which can be useful as stabilizing some metals in a desired oxidation state can be difficult.

In various embodiments, the coating 54 formed on the target surface 50 of the substrate 52 may include one or more of the low vapor pressure metals with a vapor pressure of about $10^{-2}$ Torr to about $10^{-5}$ Torr discussed above such as, Pt, Ir, Ru, W, mixtures and combinations thereof, and oxides thereof. In some embodiments, the coating 54 consists essentially of Pt, Ir, Ru or W, and in some embodiments, the coating 54 consists of Pt, Ir, Ru or W. In various embodiments, the coating 54 may be a single crystalline thin film of any of Pt, Ir, Ru or W or an alloy or an oxide thereof.

In various embodiments, which are not intended to be limiting and provided as examples, the coating 54 may have a thickness of about 50 nm to about 100 nm, or larger simply depending on coating time.

In some embodiments, the coating 54 may include Pt films with a resistivity (ρ) at room temperature of about 15 μΩcm, or similar to bulk Pt 10.6 μΩcm. The coating 54 may in some cases have a residual resistivity ratio (RRR) of greater than about 25.

In another embodiment, the present disclosure is directed to a method for making a metal coating, which includes subliming at a sublimation temperature of greater than about 0° C. and up to about 300° C. a solid metal-organic precursor compound having a vapor pressure of less than about $10^{-2}$ Torr at a temperature of about 25° C. to about 300° C. to form a flow of metal particles; and directing the flow of metal particles toward a target surface to form the coating thereon.

As noted above, in some examples the substrate 52 including the coating 54 may be utilized as an electronic component or may form a portion of an electronic component such as, for example, a capacitor plate, transistor, diode, or other portions of integrated circuits.

The systems and methods of the present disclosure will now be further described in the following non-limiting examples.

EXAMPLES

An effusion cell (E-Science, Inc., Hudson, WI, US) was used for the low temperature, 65-85° C., sublimation of $Pt(acac)_2$ (97%, MilliporeSigma, Burlington, MA, US). The powder metal-organic precursor compound was placed directly in a pyrolytic boron nitride (PBN) crucible (E-Science. Inc., US) inside an effusion cell. At 65° C. a beam equivalent pressure (BEP) of ~$2\times10^{-7}$ was measured.

Example 1

Platinum films were grown in an oxygen environment to stabilize the (001) epitaxial orientation. Oxygen was supplied at a pressure of $5\times10^{-6}$ torr by an rf plasma source (Mantis Deposition Ltd., Thame, UK) operated at 250 W and with charge deflection plates. Epitaxial platinum films were grown on $SrTiO_3$ (001) and Nb-doped $SrTiO_3$ (001) single crystal substrates (Crystec GmbH, Berlin, DE). The substrate surfaces were cleaned for 30 minutes in oxygen plasma prior to growth. Substrate temperatures were varied from 400-930° C., calibrated from the effusion cell power supply voltage and current. Following growth, the films were kept in an oxygen plasma environment during cooling to ensure the (001) orientation and phase purity.

Reflection high-energy electron diffraction (RHEED, Staib Instruments, Langenbach, DE) was carried out in-situ during and after growth to monitor the platinum film surface. Film surfaces after growth were also characterized using atomic force microscopy (AFM). High-resolution x-ray diffraction (HRXRD) was performed using a system available under the trade designation SmartLab SE from Rigaku Analytical Devices, Wilmington, MA, for structural characterization. Temperature dependent four terminal resistivity measurements were performed using indium as an ohmic contact in a Physical Properties Measurement System available under the trade designation PPMS DynaCool from Quantum Design. San Diego, CA, down to 1.8 K.

Single platinum (002) peaks were present in the HRXRD plot, as seen in FIG. 4(*a*), down to 520° C. showing a phase pure film with an epitaxial (001) orientation parallel to the substrate surface. Thickness fringes on the (002) peaks were present at higher substrate temperatures and gave thicknesses of 9 to 16 nm, linearly increasing from 760° C. to 930° C., for a one hour growth. A growth rate of 35 nm/hr was obtained when the source temperature was raised to 85° C., FIG. 5, showing that scalable growth rates are possible, especially knowing the source temperature can be increased up to 210° C., the decomposition temperature of $Pt(acac)_2$.

Although the HRXRD plot in FIG. 4(*a*) suggested single crystalline films, the microstructure of the films visualized by AFM proved otherwise. Atomically smooth islands were observed with a decreasing island size as the substrate temperature was decreased. In some cases, the elongated island morphology shown at higher temperatures is commonly attributed to the favorable agglomeration of metals on dielectric materials. In the case of Pt, it has been shown that a transition from 2-D to 3-D growth occurs as substrate temperature is increased due to the increasing capillary forces from the dielectric substrate.

A similar trend was observed with the larger degree of 3D growth at higher substrate temperatures. At a temperature of 630° C. and below, the film surface consisted of many smaller faceted islands. This can also be observed in the RHEED patterns after growth along the $SrTiO_3$ [110] azimuth, a spotty pattern occurred from transmission through these faceted islands. As the substrate temperature was increased, RHEED evolved into a streaky pattern due to diffraction from the atomically smooth island surfaces. While not wishing to be bound by any theory, at temperatures of 760° C. and higher, the RHEED patterns looked similar to previously reported patterns in which the additional small streaks were attributed to a superimposed pattern due to the additional small presence of the (110) plane on the surface. Finally, when the substrate temperature was decreased to 400° C., the Pt (002) peak disappeared and the Pt (111) peak appeared, the energetically preferred orientation for Pt.

Example 2

In this example, the polarization of the substrate was screened while retaining the template structure by growing on a conducting Nb-doped $SrTiO_3$ (001) substrate. By only changing to a metallic lower electrical boundary condition for film growth, single crystalline atomically smooth platinum films were obtained. A 70 nm platinum film with a single peak in the HRXRD plot is shown in FIG. 5. Steps are seen in the surface from AFM with a step height of one platinum unit cell. A similar RHEED pattern was obtained as those films grown at high substrate temperatures on undoped $SrTiO_3$ but with more well-defined streaks, attesting to the high quality and smooth surface.

Example 3

In this example a thicker 70 nm film was grown on $SrTiO_3$ at an intermediate substrate temperature of 760° C. along with a source temperature of 85° C. to increase the growth rate. Four probe temperature dependent resistivity measurements were performed down to 1.8 K as can be seen in FIG. 5(*d*). A room temperature resistivity (ρ) of 15.1 μΩcm was obtained, slightly larger than the bulk Pt value of 10.6 μΩcm. The Bloch-Grüneisen equation was used to fit the resistivity vs temperature behavior and a Debye temperature $\theta_D$ of 232 K was determined, agreeing well with the bulk value of 240 K.

Figure 6:
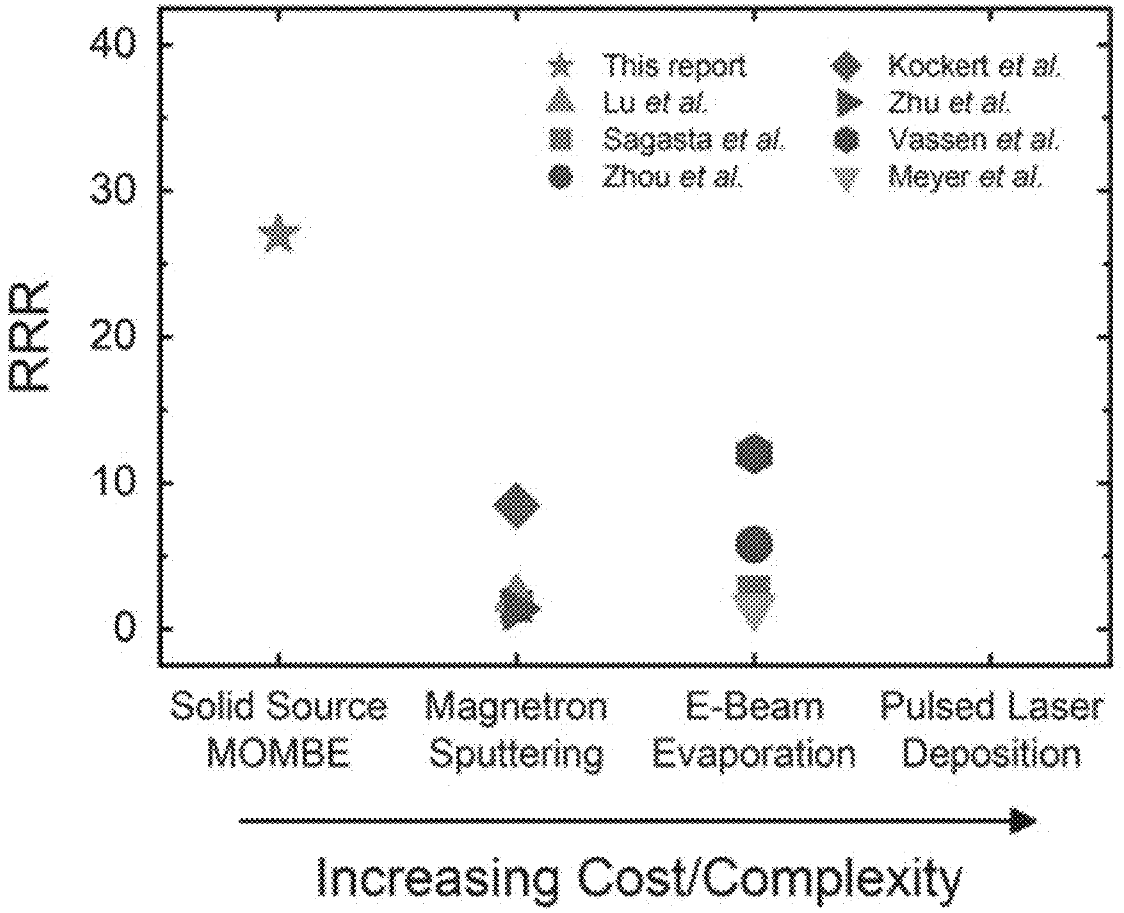
FIG. 6 is a schematic diagram of residual resistivity ratios of Pt films of the present disclosure compared to values obtained from literature reports from e-beam evaporation and magnetron sputtering PVD techniques. The techniques are ordered based on the rough cost/complexity of supplying the Pt metal.
Figure 7A:
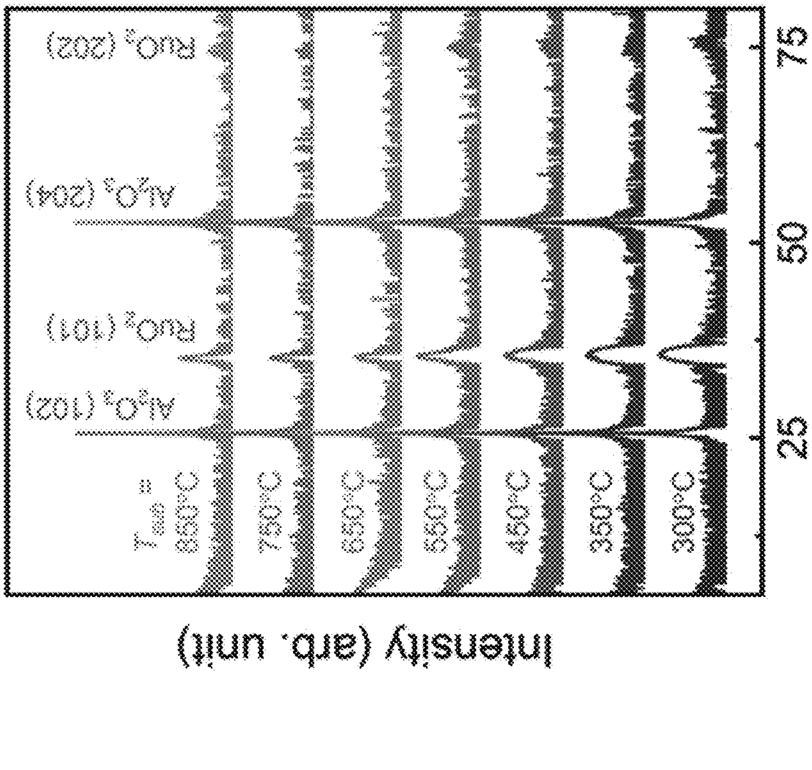
FIG. 7(*a*) is HRXRD plot of $RuO_2$ films on r-plane $Al_2O_3$ substrates with varying substrate temperature as described in Example 4.
Figure 7B:
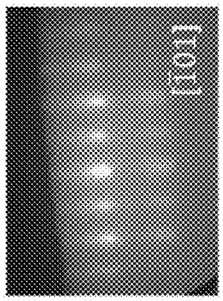
Figure 7C:
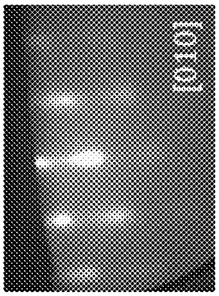
Figure 7D:
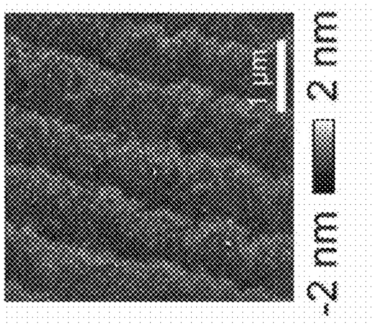
Figure 7E:
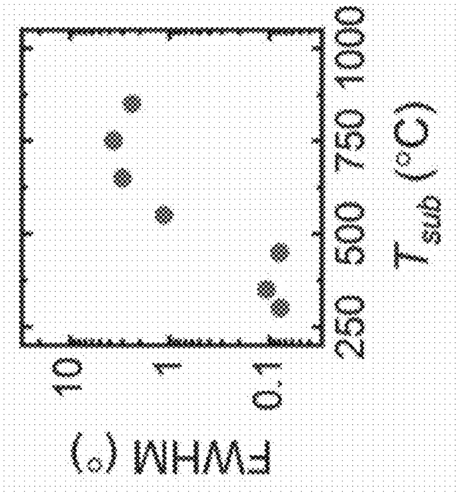
Figure 7F:
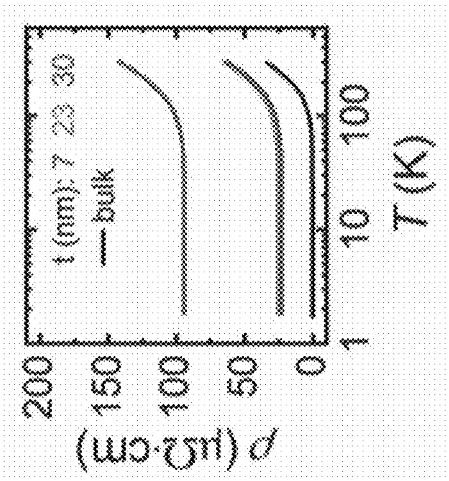

The residual resistivity ratio (RRR), defined here as ρ(300 K)/ρ(1.8 K), was 27. The RRR is a measure of the crystal quality due to the residual resistivity greatly depending on defects and impurities. The RRR of Pt films grown by the common PVD techniques is plotted against the rough cost/complexity of supplying the metal in FIG. 6.

Keeping in mind the difference in substrates and film thickness, the Pt film grown using the techniques of the present disclosure had a larger RRR while being simple and relatively cheap to deliver the Pt, i.e. low temperature sublimation in an effusion cell. As the residual resistivity is heavily influenced by impurities, a larger value would be expected to be obtained if a purer $Pt(acac)_2$ source material is used, such as ≥99.98% $Pt(acac)_2$ which is commercially available.

Example 4

To show the extent of this technique does not only apply to the simple metal Pt, $RuO_2$ films were grown on r-plane sapphire, r-$Al_2O_3$, using a $Ru(acac)_3$ source temperature of 100° C. with varying substrate temperature. The HRXRD plot of FIG. 7(*a*) shows the single (101) orientation of $RuO_2$ at all substrate temperatures, from 300° C. to 850° C. Although single phase, films grown at lower substrate temperatures showed a higher degree of crystalline order and structural quality with smooth surfaces mirroring the steps of the substrate (FIG. 7(*d*)), streaky RHEED patterns (FIGS. 7(*a*)-7(*b*)), and FWHM from the (101) rocking curve of around 0.1° (FIG. 7(*e*)). Increasing the substrate temperature caused over an order of magnitude increase in the FWHM and an increase in the growth rate, from 0.11 to 0.28 nm/min at 300° C. to 650° C. The films grown at 750° C. and 850° C. showed island formation and were too rough to determine thickness from GIXR.

Resistivity of $RuO_2$ grown at a substrate temperature of 300° C. was about 5× that of bulk $RuO_2$, as shown in FIG. 7(*f*). The resistivity did decrease as thickness was increased but remained relatively constant after 23 nm, still not reaching bulk resistivity. Regardless of substrate temperature and thickness, RRR values were around 2-3 for all films grown on r-$Al_2O_3$ expect for those grown at 750° C. and 850° C. which were insulating, most likely due to being discontinuous films from the island formation.

Example 5

$RuO_2$ films grown on r-$Al_2O_3$ having larger than bulk resistivity is not too surprising as the substrate has a different lattice size and symmetry which can greatly affect the structural quality of the epitaxial film. With $RuO_2$ having the ideal rutile structure, a series of films were grown on rutile symmetry $TiO_2$ substrates with two different orientations and on a rutile in-situ grown $SnO_2$ film to determine their lattice size and orientation effect on the electrical transport. First, FIG. 8(*a*) shows the HRXRD plot of these films compared to a $RuO_2$ grown on r-$Al_2O_3$. Single phase epitaxial films were formed following the symmetry of the respective substrate. Slight peak shifts are present in all of the films except the one grown on the 35 nm $SnO_2$ film due to residual strain in the film. By growing on the (101) rutile surface of $SnO_2$, the bulk room temperature resistivity of $RuO_2$ was recovered at the small thickness of 10 nm.

Figure 8B:
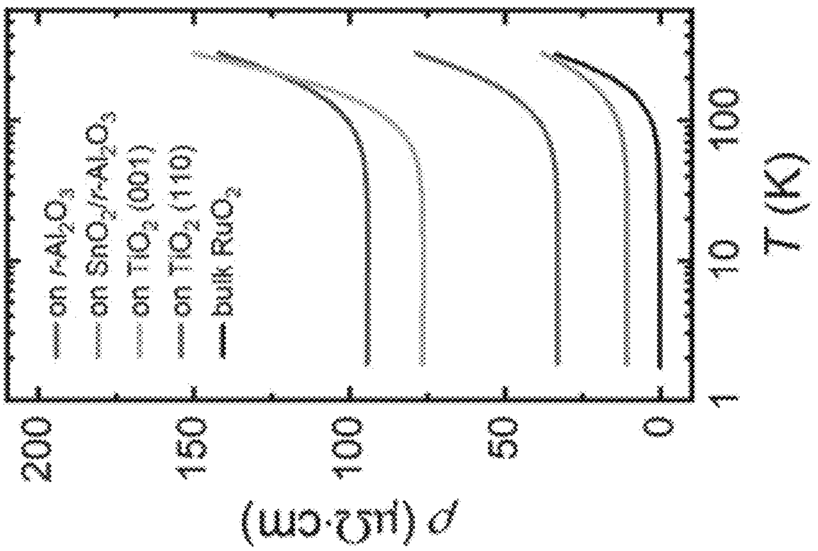
FIG. 8(*a*) is a HRXRD plot of 6-10 nm $RuO_2$ films on various substrates as described in Example 5. Bulk $RuO_2$ and $SnO_2$ expected peak positions are indicated by the black and gray dashed lines, respectively. Substrate peaks are indicated by asterisks.
Figure 8A:
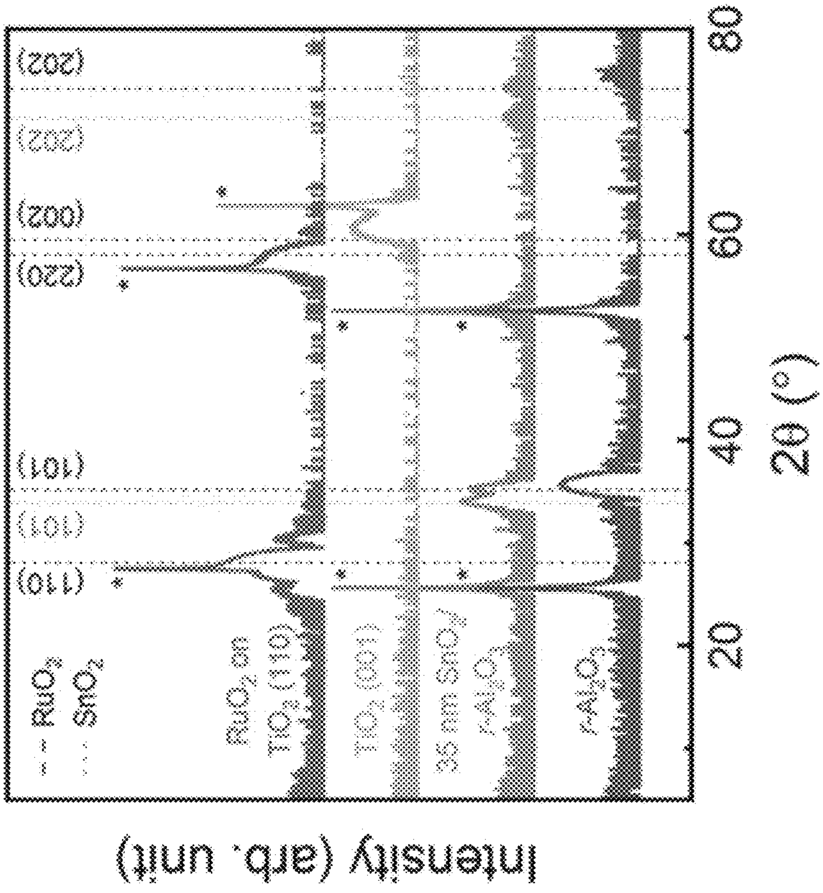

As shown in FIG. 8(*b*), the (110) and (001) orientations again showed an increased resistivity but not as large as on r-$Al_2O_3$, attesting to the increased quality when grown on the same symmetry.

Overall, the present disclosure shows that the solid source MOMBE technique grows high quality $RuO_2$ films at the low substrate temperature of 300° C. and with bulk-like room temperature resistivity.

Embodiments

Embodiment A. A system, comprising:

a vacuum chamber;

a substrate in the vacuum chamber, wherein the substrate comprises a target surface; and at least one effusion cell in the vacuum chamber, wherein the effusion cell contains a solid metal-organic precursor compound with a vapor pressure of less than about $10^{-2}$ Torr at a temperature of about 25° C. to about 300° C., and wherein the effusion cell is configured to sublime the solid metal-organic precursor compound at a sublimation temperature greater than about 0° C. and less than about 200° C. such that a stream of metal particles from the solid metal-organic precursor compound that emanate from the effusion cell are directed toward to the target surface of the substrate to form a coating thereon.

Embodiment B. The system of Embodiment A, wherein the sublimation temperature is less than about 100° C.

Embodiment C. The system of Embodiment A, wherein the sublimation temperature is less than about 85° C.

Embodiment D. The system of Embodiment A, wherein the sublimation temperature is about 65° C. to about 85° C.

Embodiment E. The system of any of Embodiments A to D, wherein the solid metal-organic precursor compound comprises a metal chosen from Pt, Ru, Ir, W, and mixtures and combinations thereof.

Embodiment F. The system of Embodiment E, wherein the solid metal-organic precursor compound comprises a β-diketonate with a metal chosen from Pt, Ir, Ru, and combinations thereof.

Embodiment G. The system of Embodiment E, wherein the β-diketonate is Pt acetylacetonate ($Pt(acac)_2$).

Embodiment H. The system of any of Embodiments A to G, wherein the target surface is heated.

Embodiment I. The system of Embodiment H, wherein the target surface is heated to a temperature of about 400° C. to about 930° C.

Embodiment J. The system of Embodiments H or I, wherein the target surface comprises $SrTiO_3$.

Embodiment K. The system of Embodiment J, wherein the $SrTiO_3$ is doped.

Embodiment L. The system of any of Embodiments A to K, further comprising an oxygen source configured to direct a beam of oxygen atoms toward the target surface.

Embodiment M. The system of any of Embodiments A to L, wherein the vacuum chamber is free of a carrier gas.

Embodiment N. The system of any of Embodiments A to M, wherein the vacuum chamber comprises a carrier gas.

Embodiment O. The system of any of Embodiments A to N, wherein vacuum chamber comprises a plurality of effusion chambers.

Embodiment P. The system of any of Embodiments A to O, wherein the coating comprises a thin film.

Embodiment Q. The system of Embodiment P, wherein the thin film comprises Pt.

Embodiment R. A method for making a coating, the method comprising:

- subliming at a sublimation temperature of greater than about 0° C. and up to about 200° C. a solid metal-organic precursor compound having a vapor pressure of less than about $10^{-2}$ Torr at a temperature of about 25° C. to about 300° C. to form a flow of metal particles; and
- directing the flow of metal particles toward a target surface to form the coating thereon.

Embodiment S. The method of Embodiment R, wherein the sublimation temperature is less than about 100° C.

Embodiment T. The method of Embodiment R, wherein the sublimation temperature is less than about 85° C.

Embodiment U. The method of Embodiment R, wherein the sublimation temperature is about 65° C. to about 85° C.

Embodiment V. The method of any of Embodiments R to U, wherein the solid metal-organic precursor compound comprises a metal chosen from Pt, Ru, Ir, W, and mixtures and combinations thereof.

Embodiment W. The method of Embodiment V, wherein the solid metal-organic precursor compound comprises a β-diketonate with a metal chosen from Pt, Ir, Ru, and combinations thereof.

Embodiment X. The method of Embodiment V, wherein the β-diketonate is Pt acetylacetonate ($Pt(acac)_2$).

Embodiment Y. The method of any of Embodiments R to X, wherein the solid metal-organic precursor compound is sublimed in an effusion chamber.

Embodiment Z. The method of Embodiment Y, wherein the effusion chamber is within a vacuum chamber.

Embodiment AA. The method of any of Embodiments R to Z, wherein the solid metal-organic precursor compound is sublimed at below atmospheric pressure.

Embodiment BB. The method of any of Embodiments R to AA, further comprising heating the target surface to a temperature of about 400° C. to about 1000° C.

Embodiment CC. The method of Embodiment BB, wherein the target surface comprises $SrTiO_3$.

Embodiment DD. The method of Embodiment CC, wherein the $SrTiO_3$ is doped.

Embodiment EE. The method of any of Embodiments R to DD, further comprising directing a flow of oxygen atoms toward the target surface.

Embodiment FF. The method of any of Embodiments R to EE, wherein the flow of metal particles toward the target surface is unimpeded by a carrier gas.

Embodiment GG. The method of any of Embodiments R to FF, further comprising subliming a plurality of solid metal-organic precursor compounds to form a plurality of streams of metal particles directed toward the substrate.

Embodiment HH. The method of an of Embodiments R to GG, wherein the coating comprises a thin film.

Embodiment II. A metal coating on a substrate, wherein the metal coating is formed from a stream of metal particles derived from subliming at a sublimation temperature of greater than about 0° C. and up to about 200° C. a solid metal-organic precursor compound having a vapor pressure of less than about $10^{-2}$ Torr at a temperature of about 25° C. to about 300° C.

Embodiment JJ. The metal coating of Embodiment 11, wherein the sublimation temperature is about 65° C. to about 85° C.

Embodiment KK. The metal coating of Embodiments II to JJ, wherein the solid metal-organic precursor compound comprises a metal chosen from Pt, Ru, Ir, W, and mixtures and combinations thereof.

Embodiment LL. The metal coating of Embodiment KK, wherein the solid metal-organic precursor compound comprises a β-diketonate with a metal chosen from Pt, Ir, Ru, and combinations thereof.

Embodiment MM. The metal coating of Embodiment LL, wherein the β-diketonate is Pt acetylacetonate ($Pt(acac)_2$).

Embodiment NN. The metal coating of any of Embodiments II to MM, wherein the coating comprises Pt.

Embodiment OO. The metal coating of Embodiment NN, wherein the metal coating consists essentially of Pt.

Embodiment PP. The metal coating of any of Embodiments II to OO, wherein the metal coating is a single crystalline Pt film.

Embodiment QQ. The metal coating of Embodiment PP, wherein the Pt film is atomically smooth.

Embodiment RR. The metal coating of Embodiments PP to QQ, wherein the Pt film has a thickness of about 50 nm to about 100 nm.

Embodiment SS. The metal coating of Embodiment RR, wherein the Pt film has a resistivity (ρ) at room temperature of greater than about 10 ρΩcm.

Embodiment TT. The metal coating of Embodiment RR, wherein the Pt film has a residual resistivity ratio (RRR) of greater than about 25.

Embodiment UU. The metal coating of any of Embodiments II to TT, wherein the solid metal-organic precursor compound is sublimed in an effusion cell.

Embodiment VV. The metal coating of Embodiment UU, wherein the effusion cell is below atmospheric pressure.

Embodiment WW. The metal coating of any of Embodiments II to VV, wherein the metal coating is derived from a combination of the stream of metal particles and a stream of oxygen atoms.

Embodiment XX. A device comprising an electronic component, wherein at least a portion of the electronic component is coated with a metal coating formed from a stream of metal particles derived from subliming at a sublimation temperature of greater than about 0° C. and up to about 200° C. a solid metal-organic precursor compound having a vapor pressure of less than about 10.2 Torr at a temperature of about 25° C. to about 300° C.

Embodiment YY. The device of Embodiment XX, wherein the electronic component is a capacitor.

Embodiment ZZ. A system comprising:

a vacuum chamber;

a substrate in the vacuum chamber, wherein the substrate comprises a target surface; at least one effusion cell in the vacuum chamber, wherein the effusion cell contains a solid metal-organic precursor compound with a vapor pressure of less than about $10^{-2}$ Torr at a temperature of about 25° C. to about 250° C., and a controller configured to operate the effusion cell to sublime the solid metal-organic precursor compound at a sublimation temperature greater than about 0° C. and less than about 200° C. such that a stream of metal particles from the solid metal-organic precursor compound emanate at a predetermined effusion rate from the effusion cell and are directed toward the target surface of the substrate to form a coating thereon.

Embodiment AAA. The system of Embodiment ZZ, wherein the controller is configured to control a temperature of the target surface from about 400° C. to about 1000° C.

Embodiment BBB. The system of Embodiments ZZ to AAA, wherein the vacuum chamber further comprises a source of oxygen atoms, and wherein the controller is configured to control the source of oxygen atoms to provide a stream of oxygen atoms directed toward the substrate such that oxygen is incorporated into the coating at a predetermined rate.

Various embodiments of the invention have been described. These and other embodiments are within the scope of the following claims.

The invention claimed is:

1. A system comprising:

a vacuum chamber;

a substrate in the vacuum chamber, wherein the substrate comprises a target surface; and at least one effusion cell in the vacuum chamber, wherein the at least one effusion cell contains a solid metal-organic precursor compound with a vapor pressure of less than about $10^{-2}$ Torr at a temperature of about 25° C. to about 300° C., wherein the at least one effusion cell is configured to sublime the solid metal-organic precursor compound at a sublimation temperature greater than about 0° C. and less than about 200° C. and cause a stream of metal particles from the solid metal-organic precursor compound that emanate from the effusion cell to be directed towards the target surface of the substrate to form a coating thereon, and wherein the vacuum chamber is free of a carrier gas.

2. The system of claim 1, wherein the sublimation temperature is less than about 85° C.

3. The system of claim 1, wherein the solid metal-organic precursor compound comprises a metal from Pt, Ru, Ir, W, and mixtures and combinations thereof.

4. The system of claim 3, wherein the solid metal-organic precursor compound comprises a β-diketonate with a metal from Pt, Ir, Ru, and combinations thereof.

5. The system of claim 1, wherein the target surface is heated to a temperature of about 400° C. to about 930° C.

6. The system of claim 1, wherein the target surface comprises $SrTiO_3$.

7. The system of claim 1, further comprising an oxygen source configured to direct a beam of oxygen atoms toward the target surface.

8. The system of claim 1, wherein the coating comprises a thin film, and wherein the thin film comprises Pt.

9. A method for making a coating, the method comprising:

subliming at a sublimation temperature of greater than about 0° C. and up to about 200° C. a solid metal-organic precursor compound having a vapor pressure of less than about $10^{-2}$ Torr at a temperature of about 25° C. to about 300° C. to form a flow of metal particles within a vacuum chamber free of a carrier gas; and directing the flow of metal particles toward a target surface to form the coating thereon.

10. The method of claim 9, wherein the sublimation temperature is about 65° C. to about 85° C.

11. The method of claim 9, wherein the solid metal-organic precursor compound comprises a β-diketonate with a metal chosen from Pt, Ir, Ru, and combinations thereof.

12. The method of claim 9, wherein the target surface comprises $SrTiO_3$.

13. The method of claim 9, further comprising directing a flow of oxygen atoms toward the target surface.

14. A metal coating on a substrate, wherein the metal coating is formed from a stream of metal particles derived from subliming at a sublimation temperature of greater than about 0° C. and up to about 200° C. a solid metal-organic precursor compound having a vapor pressure of less than about $10^{-2}$ Torr at a temperature of about 25° C. to about 300° C. within a vacuum chamber free of a carrier gas.

15. The metal coating of claim 14, wherein the sublimation temperature is about 65° C. to about 85° C.

16. The metal coating of claim 14, wherein the solid metal-organic precursor compound comprises a metal chosen from Pt, Ru, Ir, W, and mixtures and combinations thereof.

17. The metal coating of claim 16, wherein the solid metal-organic precursor compound comprises a β-diketonate with a metal chosen from Pt, Ir, Ru, and combinations thereof.

18. The metal coating of claim 14, wherein the metal coating is a single crystalline Pt film.

19. The metal coating of claim 18, wherein the Pt film has a thickness of about 50 nm to about 100 nm.

20. A system comprising:

a vacuum chamber;

a substrate in the vacuum chamber, wherein the substrate comprises a target surface; and at least one effusion cell in the vacuum chamber, wherein the at least one effusion cell contains a solid metal-organic precursor compound with a vapor pressure of less than about $10^{-2}$ Torr at a temperature of about 25° C. to about 300° C., wherein the at least one effusion cell is configured to sublime the solid metal-organic precursor compound at a sublimation temperature greater than about 0° C. and less than about 200° C. and cause a stream of metal particles from the solid metal-organic precursor compound that emanate from the at least one effusion cell to be directed towards the target surface of the substrate to form a coating thereon; and an oxygen source configured to direct a beam of oxygen atoms toward the target surface.

21. A method for making a coating, the method comprising:

subliming at a sublimation temperature of greater than about 0° C. and up to about 200° C. a solid metal-organic precursor compound having a vapor pressure of less than about $10^{-2}$ Torr at a temperature of about 25° C. to about 300° C. to form a flow of metal particles;

directing a flow of oxygen atoms toward a target surface; and directing the flow of metal particles toward the target surface to form the coating thereon.

* * * * *